United States Patent [19]

Herndon

[11] 4,257,059
[45] Mar. 17, 1981

[54] INVERSE TRANSISTOR COUPLED MEMORY CELL

[75] Inventor: William H. Herndon, Sunnyvale, Calif.

[73] Assignee: Fairchild Camera and Instrument Corp., Mountain View, Calif.

[21] Appl. No.: 971,623

[22] Filed: Dec. 20, 1978

[51] Int. Cl.³ ................... H01L 27/04; H03K 19/082
[52] U.S. Cl. ........................ 357/46; 307/291; 307/303; 307/238.6; 357/35; 357/40; 357/43
[58] Field of Search ............... 307/238, 289, 291, 303; 357/44, 46, 92, 40, 35, 43; 365/154, 155, 188

[56] References Cited

U.S. PATENT DOCUMENTS 4,144,586  3/1979  U ................................ 307/238 X

Primary Examiner—John Zazworsky
Attorney, Agent, or Firm—Paul J. Winters; Theodore S. Park; Ronald J. Meetin

[57] ABSTRACT

A semiconductor memory cell comprising first and second bipolar cell transistors cross-coupled by the inverse transistor action of third and fourth bipolar transistors. Each cross-coupling transistor is formed by a single emitter diffusion in an existing common base region of one cell transistor, above a common buried collector region of the same cell transistor. The use of cross-coupling transistors eliminates the need for a direct ohmic connection to the buried layer collector, thereby simplifying layout and reducing memory cell size.

2 Claims, 5 Drawing Figures

INVERSE TRANSISTOR COUPLED MEMORY CELL

FIELD OF THE INVENTION

This invention relates to an improved semiconductor structure wherein a contact is provided for electrical conduction to a buried semiconductor region, and more particularly this invention relates to an improved means for cross-coupling a static bipolar memory cell.

BACKGROUND OF THE INVENTION

A digital memory is arranged as an array of individual memory cells, each cell representing a single bit. This invention is an improvement in the structure of a particular type of digital memory cell: the bipolar static flip flop.

The basic bipolar memory cell is well known. It consists of a pair of bipolar transistors cross-coupled to form a flip flop. The base of one is directly connected to the collector of the other and the collector of the other is directly connected to the base of the first. The flip flop, or cell, is completed by providing a suitable loan means connected to each collector, and power supply voltages.

When the basic bipolar memory cell is formed with a buried layer collector, a special problem arises in contacting the buried layer. Normally, the base region essentially covers the buried collector. In order to provide the direct, or ohmic, connection to the buried layer, it is necessary to extend the buried layer collector so that a portion of it protrudes outwardly in the horizontal plane. The extended portion of the buried layer collector has no base layer above it. Therefore, the buried collector may be extended to the planar surface of the integrated circuit. Once the buried layer is accessible on the surface, a direct connection is used to cross-couple the memory cell. Cross coupling the cell as described above often requires special processing steps and increases the size of the basic cell.

SUMMARY OF THE INVENTION

The present invention provides a means for cross-coupling the memory cell by the inverse transistor action of two cross-coupling transistors. Each cell transistor is formed by three horizontal layers, the collector being a buried layer. To create each cross-coupling transistor an additional emitter region is formed in the base region above the buried layer collector. The resulting transistor, operated in an inverse mode, provides a conduction path to the buried collector.

DETAILED DESCRIPTION

A primary goal in the design and fabrication of integrated circuits is the reduction of chip size for a circuit that performs a given function. The present invention facilitates this reduction in semiconductor memories utilizing a static bipolar memory cell.

Figure 1:
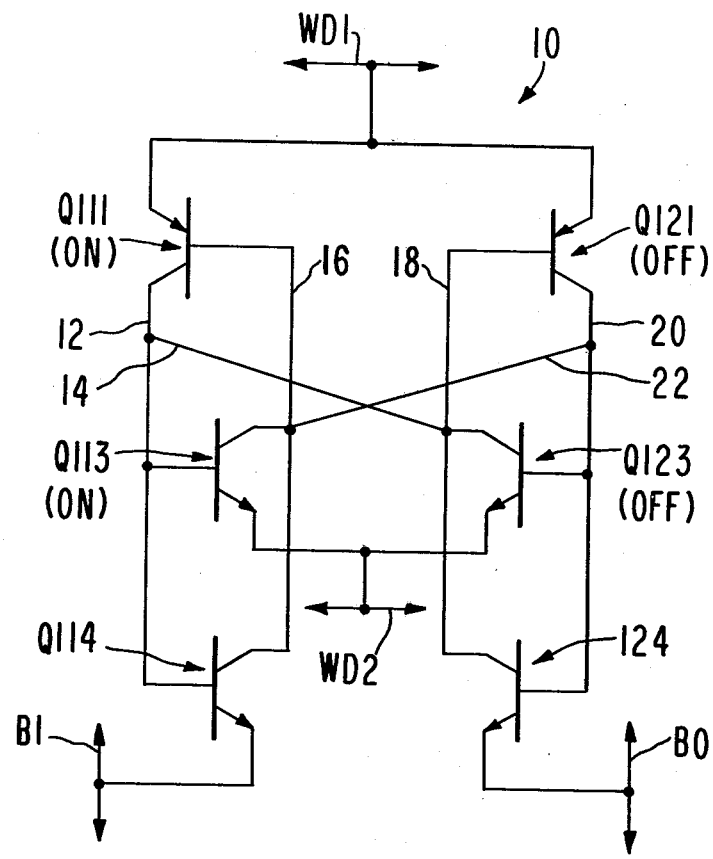
FIG. 1 is a schematic diagram of a bipolar memory cell known in the prior art.

The basic circuit of a bipolar memory cell is shown schematically in FIG. 1. Transistors Q113 and Q123 are cross-coupled to form a flip flop. Transistors Q111 and Q121 are active load devices for the flip flop transistors. Q114 and Q124 are used for reading data out of the flip flop and writing new data into the flip flop.

The flip flop has two stable states. When Q113 is on, Q123 is off, and vice versa. As indicated in FIG. 1, when Q113 is on, its active load device Q121 is off, and when Q123 is on, its active load device Q111 is off. FIG. 1 shows the on and off conditions for one of the two stable states of the flip flop.

The flip flop is stable because when Q113 is on, node 20 is held at the potential of WD2, which in turn keeps transistor Q123 off. Transistor Q111 is on because conduction through Q113 also forward biases Q111. Q121 is off because node 12 is held close to the potential of WD1.

Terminals WD1 and WD2 serve a dual purpose: first, they are the power supply terminals for receiving an operating potential and a reference potential respectively; second, they are used as address lines to select a memory word to be accessed. WD1 and WD2 receive power supply voltages which are modulated by appropriate word select signals. Using common lines to provide power and addressing is well known to those skilled in the art. Also, the use of transistors Q114 and Q124 for reading and writing data is a well known technique. However, since the write operation for the invented cell is slightly different than the write operation for the prior art cell, a write sequence will be reviewed.

Assume that the states of the transistors in the circuit diagram in FIG. 1 are as indicated. To make the flip flop change states a potential more negative than WD2 is applied to terminal BO. This forward biases the base emitter junction of transistor Q124, turning that transistor on. Transistor Q124 will then sink all of the current provided by transistor Q111, leaving no current into the base of transistor Q113. Starved for base current, Q113 will turn off. When Q113 turns off, its collector current stops. Since the base emitter current of Q111 cannot be maintained, Q111 stops conducting and goes into an off state. Q124 now draws current through the emitter base junction of Q121 turning that transistor on. Also, as Q113 and Q111 stop conducting, the voltage at circuit node 20 rises, forward biasing the base emitter junction of Q123 turning that transistor on. The flip flop is now in the opposite stable state. A write operation has been accomplished.

Figure 2:
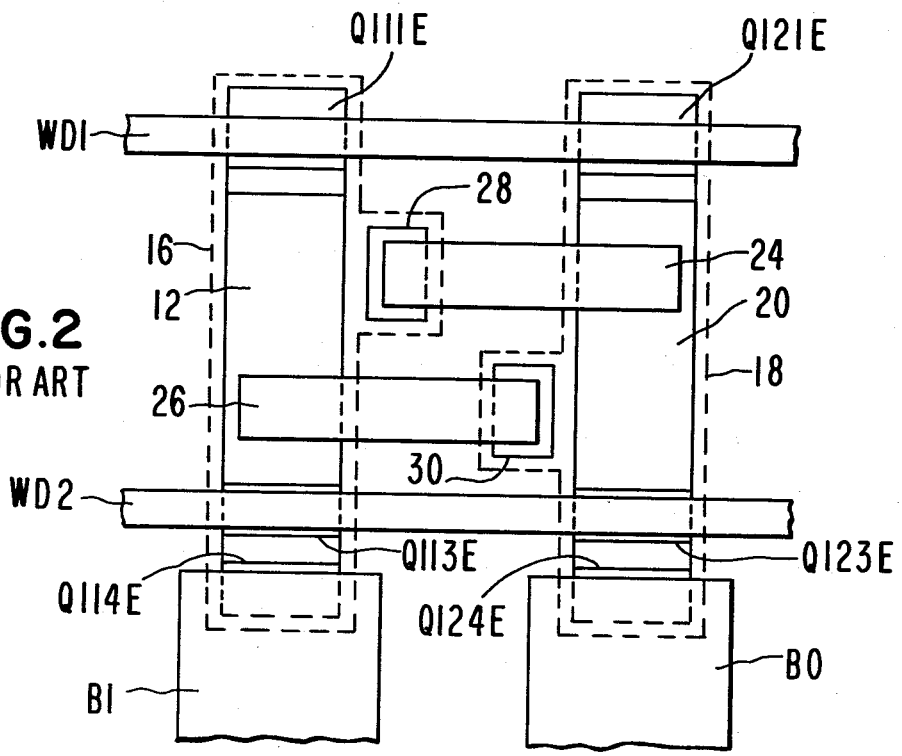
FIG. 2 is an integrated circuit composite layout of the cell of FIG. 1.

A composite layout of the circuit of FIG. 1 in integrated circuit form is shown in FIG. 2. Like elements have been labelled with like numerals. As can be seen in FIG. 2, the buried collector 16 is indicated by a dotted line. This region forms a buried collector which is the collector of transistors Q113 and Q114 and is also the base of transistor Q111. Similarly, the buried collector 18 indicated in FIG. 2 as a dotted line is a common collector for transistors Q123 and Q124 and also serves as the base of transistor Q121. The areas, 12 and 20, in FIG. 2 are epitaxial regions grown on top of the buried layer collectors. Region 12 serves as the base of Q113 and as the base of Q114 as well as the collector of Q111. Region 20 serves as the base of Q123 and Q124, as well as being the collector of Q121.

Of particular significance are the cross-coupling connections 14 and 22 (FIG. 1). These connections connect the base of each transistor to the collector of the other. In order to cross-couple the cell in the integrated circuit, it is necessary to make contact with the buried layer. In FIG. 2 as indicated by dotted line 16 the buried collector is extended horizontally and a region of the semiconductive material 28 of the same conducitivity type as the buried layer extends the buried layer to the planar surface. Conductor 24 completes the connection from the buried layer collector to the base of the other transistor. Similarly, conductor 26 and semiconductor region 30 comprise the other cross-coupling connection.

Figure 3:
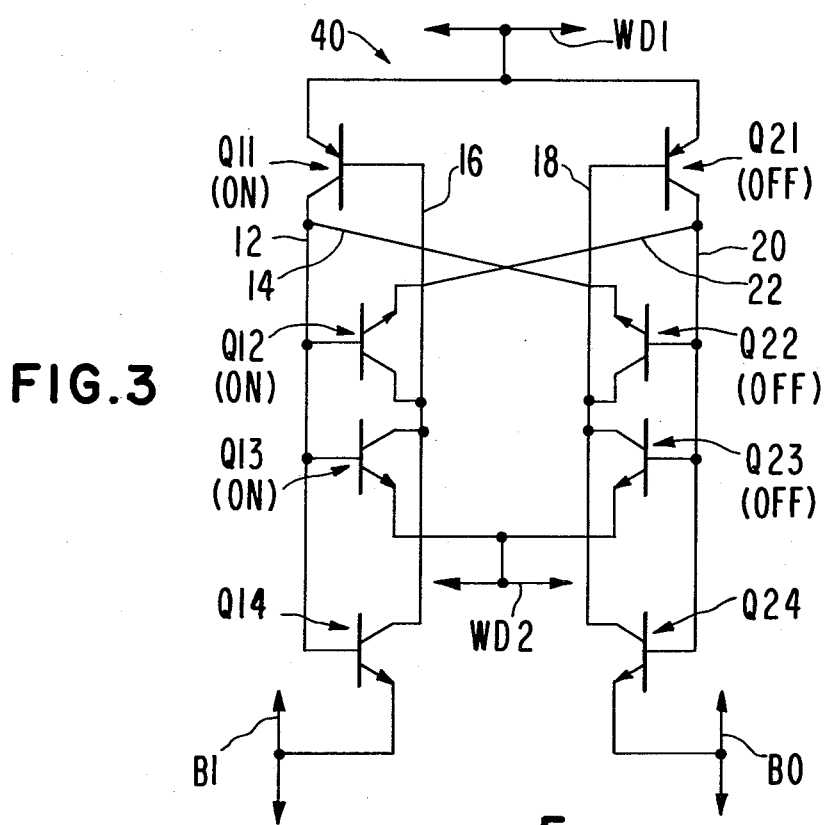
FIG. 3 is a schematic diagram of an embodiment of the present invention.

The present invention provides a means for cross-coupling the flip flop transistors without a direct connection down to the buried layer collector. As shown in FIG. 3 two additional transistors, Q12 and Q22, are provided to cross-couple the base flip flop transistors Q13 and Q23. Before outlining in detail the operation and geometry of the present invention, it is worthwhile to define the terms emitter, base, and collector.

A bipolar transistor has three semiconductor regions. Its geometry may be symmetrical or asymmetrical. In either case, the base is defined geometrically as the middle region. If a transistor is completely symmetrical, the emitter and collector may be interchanged without affecting its operating characteristics. In an asymmetrical device the emitter and collector can be interchanged, but its operating characteristics, such as $\beta$, will be affected. Ordinarily, the emitter and collector are defined by the operating potentials that are applied to those electrodes. However, as used herein, the emitter, base and collector are defined by their geometric relation to each other. For a planar type of structure as we have here, the lowest layer (which can be the entire substrate) is defined as the collector, the first diffusion having a planar surface within the collector region is defined as the base, and the second diffusion having a planar surface within the first diffusion is defined as the emitter. These definitions will be adhered to regardless of the potentials applied to the device.

As mentioned earlier, Q12 and Q22 cross-couple the basic flip flop transistors Q13 and Q23. This can be seen as follows. Assume Q13 is on. The base-emitter junction of Q13 has a forward bias voltage drop of approximately 0.7 volts. As Q13 is conducting in saturation, its collector is approximately at the potential of its emitter (plus the small saturation voltage). Therefore, the base-collector junction of Q12 is forward biased. Proper operation requires that the voltage forward biasing the base-collector junction of each cross-coupling transistor be essentially equal to the voltage forward biasing the base-emitter junction plus the collector-emitter saturation voltage of each associated cell transistor. Furthermore, transistor junction characteristics must track each other. These conditions are satisfied by fabricating all devices on a common substrate by the same manufacturing process steps.

Since the emitter of Q12 is at a higher potential than its collector, it is operated in the inverse mode. That is, it will conduct from its emitter to its collector. The resulting current cross-couples the collector of Q13 to the base of Q23. Note, however, that cross-coupling transistor Q22 is off and therefore not cross-coupling its respective cell transistor. However, since Q23 is in the off state, it is not necessary that it be cross-coupled at this time. When the flip flop is in its opposite state, i.e., with Q23 on, then, following an analysis similar to the foregoing, cross-coupling transistor Q22 will be on. That is, when Q23 is on, Q22 is operated in an inverse mode cross-coupling the collector of Q23 to the base of Q13.

Figure 4:
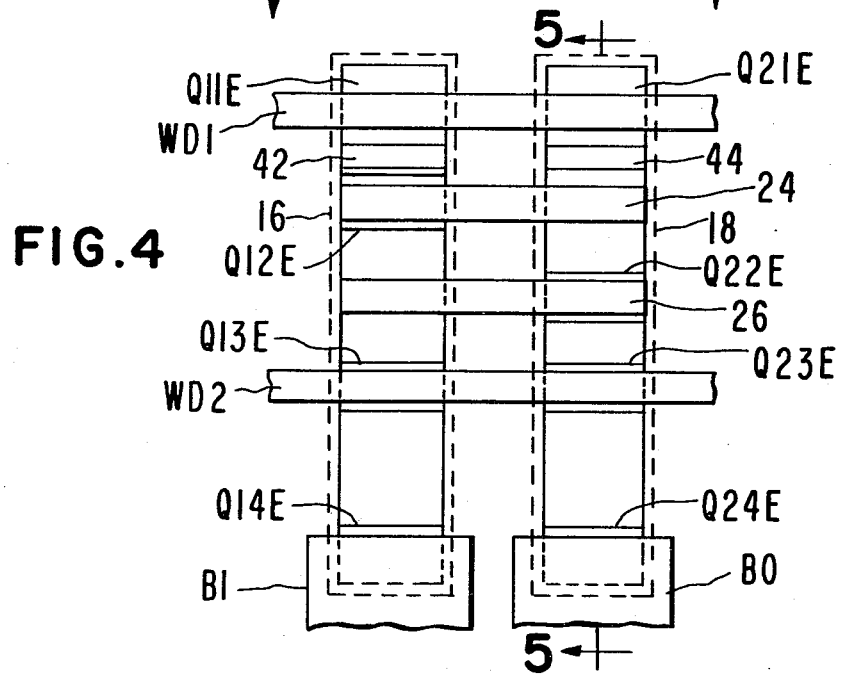
FIG. 4 is an integrated circuit composite layout of the cell of FIG. 3.

The advantage of using cross-coupling transistors as described above is that it avoids the need to contact the buried layer directly. This is primarily a topological advantage in that the cell is simpler and smaller. Referring to FIG. 4, it can be seen that the direct ohmic connections to the buried layer have been eliminated. A complete transistor Q12 is formed by diffusing a single N-type emitter region indicated by Q12E in FIG. 4. In a similar manner the entire transistor Q22 is formed by diffusing a single emitter diffusion Q22E.

Figure 5:
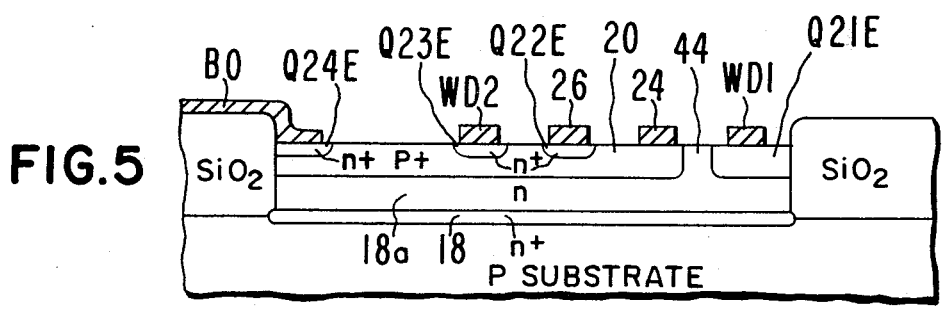
FIG. 5 is a cross-sectional view of an integrated circuit memory cell embodying the present invention.

Referring to the cross-sectional view in FIG. 5, the cross-coupling transistors can be more readily seen. The cross-section shows the structure of one of the cross-coupling transistors Q22. As indicated in FIG. 5, the emitter of Q22 is indicated by Q22E. The P-type region 20 directly below forms the base of Q22, and the buried layer 18 forms the collector of Q22.

The buried layer collector is more heavily doped to achieve high conductivity. On the other hand, N-type region 18a is indicated as being more lightly doped. While this is not essential to the operation of Q22 or Q23, it is important that the base region 44 be more lightly doped to achieve a higher gain for transistor Q21. Typical doping concentrations for a cross-coupling transistor (such as Q12 or Q22) constructed in accordance with this invention are $2\times10^{19}$ (buried collector), $2\times10^{18}$ (implanted base), $10^{21}$ (emitter) and $5\times10^{16}$ (epitaxial layer). The N-type impurity used for the collector typically is antimony, the P-type impurity used for the base typically is boron, the N-type impurity used for the emitter typically is phosphorus and the epitaxial layer is typically doped with either a P-type or N-type impurity such as boron or phosphorus. Typically the epitaxial layer is formed using either silane or dichlorosilane in an epitaxial reactor although silicon tetrachloride could also be used.

The cross-sectional view of FIG. 4 also shows transistor Q21. The emitter of Q21 is indicated as Q21E. Its base is indicated as region 44 and its collector by region 20.

The read-write transistor Q24 can also be seen in the cross-sectional view of FIG. 5. Its emitter is labelled Q24E. The base of Q24 is region 20 and the collector is the common buried collector 18. Cross-coupling is achieved by transistor action to the buried layer 18 through transistor Q22. Current flow is into the emitter of Q22, through the base region 20, and down to the buried layer collector 18. Conduction is through inverse transistor action as opposed to direct ohmic contact.

As previously mentioned, the presence of the cross-coupling transistors Q12 and Q22 result in a slightly different sequence for a write operation. For reading data the operation is exactly the same as in the prior art circuit.

Assume that in the flip flop of FIG. 3, Q13 is on and Q23 is off. To write data into the flip flop which will flip the cell to the opposite state, a potential more negative than WD2 is placed on terminal BO. Since transistor Q22 is off, transistor Q24 cannot conduct current from Q11 as in the prior art circuit. In this circuit, Q21 is turned on first. Turning on Q21 will turn on Q23, which in turn, turns on Q22. Now Q22 will cross-couple the cell through inverse transistor action. From this point on the write operation is the same as in the previous circuit. Transistor Q24 now can conduct the collector current on Q11 to switch the state of the flip flop as previously described.

What is claimed is:

1. A semiconductor memory cell comprising:
   a unitary body of semiconductive material of a first conductivity type:
   a first semiconductive region of a second conductivity type disposed in P-N junction forming relation with the semiconductive body;
   a second semiconductive region of a second conductivity type separate from the first semiconductive region and disposed in P-N junction forming relation with the semiconductive body;
   third and fourth epitaxial layers of semiconductive material of the first conductivity type disposed in P-N junction forming relation with the first and second regions respectively on the surface thereof remote from the semiconductor body;
   fifth and sixth separate semiconductive regions of the second conductivity type disposed in P-N junction forming relation with the third layer of semiconductive material;
   seventh and eighth separate semiconductive regions of the second conductivity type disposed in P-N junction forming relation with the fourth layer of semiconductive material;
   conducting means for connecting the third layer to the eighth region; and
   conducting means for connecting the fourth layer to the sixth region.

2. In a semiconductor memory cell having a unitary body of semiconductor material of a first conductivity type, first and second bipolar transistors each having a separate buried collector region of a second conductivity type and a separate emitter region of the second conductivity type with a planar surface, and each having a separate base region of the first conductivity type with a planar surface, an improved means for cross-coupling the first and second transistors, said means comprising:
   a first semiconductive region of the second conductivity type disposed in P-N junction forming relation with the base of the first bipolar transistor and forming a substructure operable as a third transistor wherein said first semi-conductive region serves as the emitter, said buried collector region of the first transistor serves as the collector, and said base region of the first transistor serves as the base;
   a second semiconductive region of the second conductivity type disposed in P-N junction forming relation with the base of the second bipolar transistor and forming a substructure operable as a fourth transistor wherein said second semiconductive region serves as the emitter, said buried collector region of the second transistor serves as the collector, and said base region of the second transistor serves as the base;
   conducting means for connecting the first semiconductive region to the base region of the second transistor; and
   conducting means for connecting said second semiconductive region to the base region of the first transistor.

* * * * *